United States Patent
Shafer et al.

(10) Patent No.: US 7,546,499 B1
(45) Date of Patent: Jun. 9, 2009

(54) COMMUNICATION SIGNAL TESTING WITH A PROGRAMMABLE LOGIC DEVICE

(75) Inventors: Matthew S. Shafer, Ankeny, IA (US); Bodhisattva Das, Ames, IA (US); William C. Black, Ames, IA (US); Scott Alan Irwin, Ames, IA (US)

(73) Assignee: XILINX, Inc., San Jose, CA (US)

( * ) Notice: Subject to any disclaimer, the term of this patent is extended or adjusted under 35 U.S.C. 154(b) by 25 days.

(21) Appl. No.: 11/699,113

(22) Filed: Jan. 29, 2007

Related U.S. Application Data

(62) Division of application No. 10/660,243, filed on Sep. 11, 2003, now Pat. No. 7,188,283.

(51) Int. Cl.
*G01R 31/28* (2006.01)

(52) U.S. Cl. .................. 714/725; 714/738

(58) Field of Classification Search .......... 714/3, 714/7, 22, 724, 725, 721, 718, 740, 699, 714/738, 733, 734, 37, 74
See application file for complete search history.

(56) References Cited

U.S. PATENT DOCUMENTS

| | | | |
|---|---|---|---|
| 5,414,713 A | 5/1995 | Waschura et al. | |
| 5,661,685 A * | 8/1997 | Lee et al. | 365/185.22 |
| 5,815,507 A * | 9/1998 | Vinggaard et al. | 714/704 |
| 5,889,701 A * | 3/1999 | Kang et al. | 365/185.18 |
| 6,232,893 B1 * | 5/2001 | Cliff et al. | 341/78 |
| 6,239,611 B1 * | 5/2001 | Matera | 326/16 |
| 6,292,911 B1 * | 9/2001 | Swanson | 714/715 |
| 6,366,224 B2 * | 4/2002 | Cliff et al. | 341/78 |
| 6,618,686 B2 | 9/2003 | Allamsetty | |
| 6,647,301 B1 | 11/2003 | Sederlund et al. | |
| 6,687,867 B2 * | 2/2004 | Ni | 714/738 |
| 6,874,107 B2 * | 3/2005 | Lesea | 714/725 |
| 7,062,586 B2 | 6/2006 | Donlin et al. | |
| 7,062,696 B2 * | 6/2006 | Barry et al. | 714/738 |
| 7,302,625 B1 * | 11/2007 | Payakapan et al. | 714/733 |

* cited by examiner

*Primary Examiner*—Phung M Chung
(74) *Attorney, Agent, or Firm*—W. Eric Webostad; Michael R. Hardaway

(57) ABSTRACT

Method and apparatus for configuring a programmable logic device to perform testing on a signal channel is described. Configurable logic of the programmable logic device is configured for a test mode. Configurable interconnects are configured for communication from or to the configurable logic to or from transceivers coupled to the configurable input/output interconnect to communicate test signals.

7 Claims, 6 Drawing Sheets

COMMUNICATION SIGNAL TESTING WITH A PROGRAMMABLE LOGIC DEVICE

FIELD OF THE INVENTION

One or more aspects of the invention relate generally to communication signal testing and more particularly to test support circuitry implemented through a programmable logic device for testing signal parameters.

BACKGROUND OF THE INVENTION

Conventionally, external test equipment is connected to an integrated circuit through a communication signal channel to test signaling. However, use of such external test equipment is subject to limitations. For example, external test equipment may not be able to test at a data rate intended for use of such an integrated circuit communicating over such a communication signal channel. Testing at a lower data rate than an intended data rate may lead to a misimpression of quality. Furthermore, external test equipment may adversely add to test uncertainty by adding parasitic effects. Furthermore, external test equipment may not be readily available in factory remote locations, such as where an integrated circuit may be deployed.

Alternatively, Application Specific Integrated Circuits ("ASICs") or Application Specific Standard Products ("ASSPs") may be built with specific tests in mind. Such ASICs or ASSPs could then form part of a device for self-testing the device. However, ASICs and ASSPs conventionally are not reprogrammable, in contrast to a programmable logic device ("PLD"). Furthermore, addition of one or more ASICs or ASSPs adds a fixed cost to a product for purposes of testing.

One type of PLD is known as Field Programmable Gate Array ("FPGA"). Modern day FPGAs have high speed interfaces, sometimes referred to as "multi-Gigabit transceivers" or "MGTs." Furthermore, such FPGAs are reprogrammable, and in some instances may be partially reprogrammed during operation, sometimes referred to as "on-the-fly" programming.

Accordingly, it would be desirable and useful to deploy a PLD having MGTs for testing a communication channel, where such a PLD may be fully or partially reprogrammed after such testing for one or more other uses.

SUMMARY OF THE INVENTION

An aspect of the invention is a method for testing a signal channel, comprising: coupling a first programmable logic device to the signal channel; configuring the first programmable logic device to send test signals over the signal channel; coupling a second programmable logic device to the signal channel to receive the test signals; configuring the second programmable logic device for a test mode to process the test signals for transmissivity; and reconfiguring the first programmable logic device and the second programmable logic device for another test mode while coupled to the signal channel.

Another aspect of the invention is a method for testing a signal channel, comprising: coupling a first programmable logic device to the signal channel; configuring the first programmable logic device to send test signals over the signal channel; coupling a second programmable logic device to the signal channel to receive the test signals; configuring the first programmable logic device for a test mode to process reflected versions of the test signals; and reconfiguring the first programmable logic device and the second programmable logic device for another test mode while coupled to the signal channel.

Another aspect of the invention channel test system, comprising: a programmable logic device having programmable logic; and configuration memory coupled to the programmable logic device for storing applications for channel testing, where the applications for channel testing are for configuring the programmable logic device to perform respective test operations.

Another aspect of the invention is a programmable logic device, comprising: configurable logic configured with a pattern detector, the pattern detector configured for a test mode; a configurable input/output interconnect coupled to the configurable logic; and transceivers coupled to the configurable input/output interconnect. The configurable input/output interconnect configured to communicate test signals received by at least one transceiver of the transceivers to the pattern detector.

Another aspect of the invention is a programmable logic device, comprising: configurable logic configured with a pattern generator configured for a test mode; a configurable input/output interconnect coupled to the configurable logic; and transceivers coupled to the configurable input/output interconnect. The configurable input/output interconnect configured to communicate test signals from the pattern generator for transmission by at least one transceiver of the transceivers.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1A:
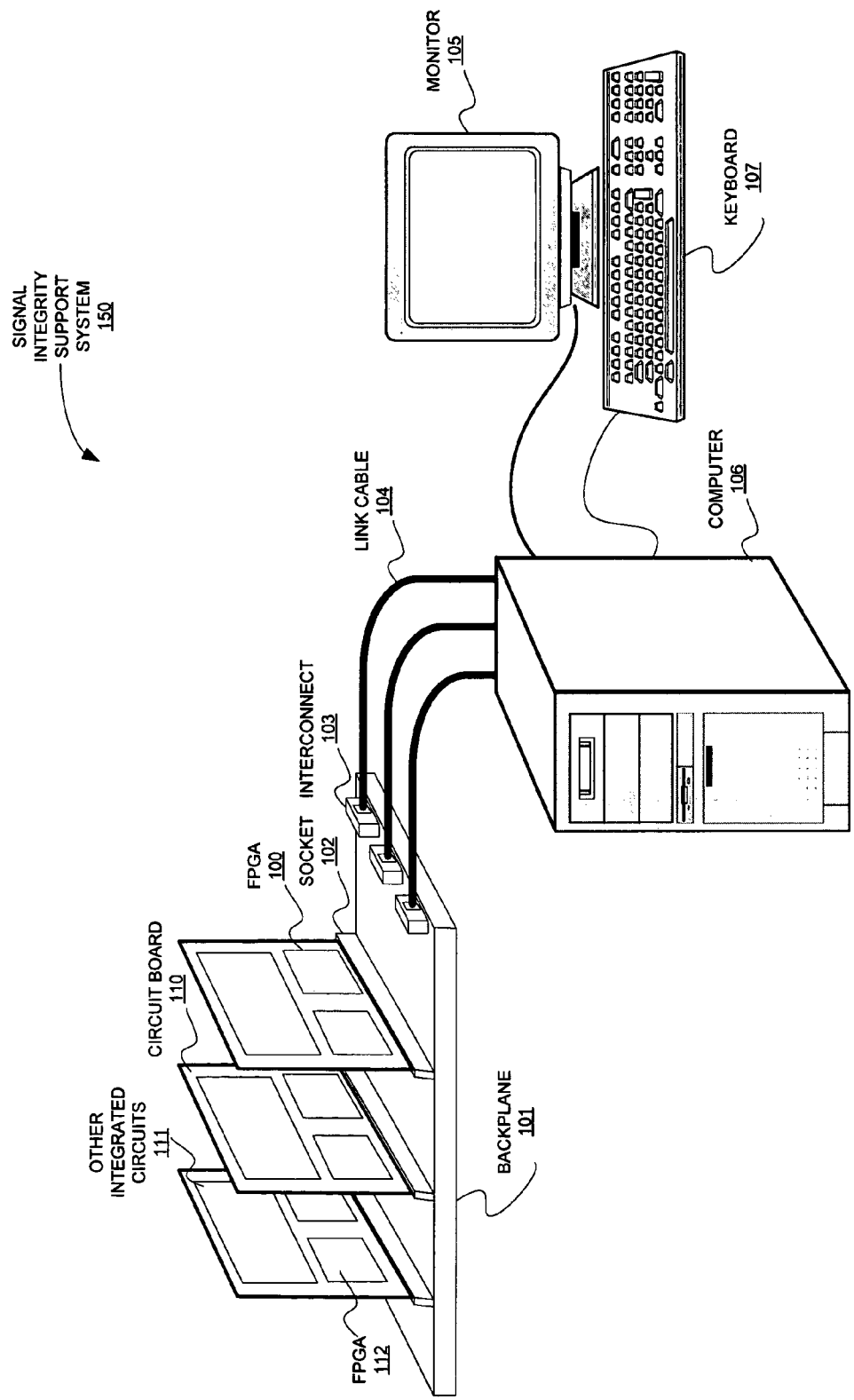
FIG. 1A is a pictorial diagram depicting an exemplary embodiment of a signal integrity support system.

FIG. 1A is a pictorial diagram depicting an exemplary embodiment of a signal integrity support system 150. System 150 includes computer 106 coupled to backplane 101 via link cables 104 and interconnects 103. Computer 106 may be connected to a monitor 105 and a keyboard 107, as well as other well-known peripherals that may be put in communication with a computer. Backplane 101 has sockets 102 for receiving circuit boards 110. Circuit boards 110 may include one or more FPGAs, such as FPGAs 100 and 112, as well as other integrated circuits 111 depending on implementation. In an implementation, FPGAs 100 and 112 may be for different functions and may be daisy chained. FPGAs 100 and 112 may provide one or more of a service, an application or an interface to other integrated circuits 111 depending on implementation. For example, an FPGA may be used to generate register values to setup one or more other integrated circuits 111.

Notably, though an FPGA is used as an example of a PLD for purposes of clarity it should be understood that other programmable integrated circuits may be used in accordance with the description that follows.

Figure 1B:
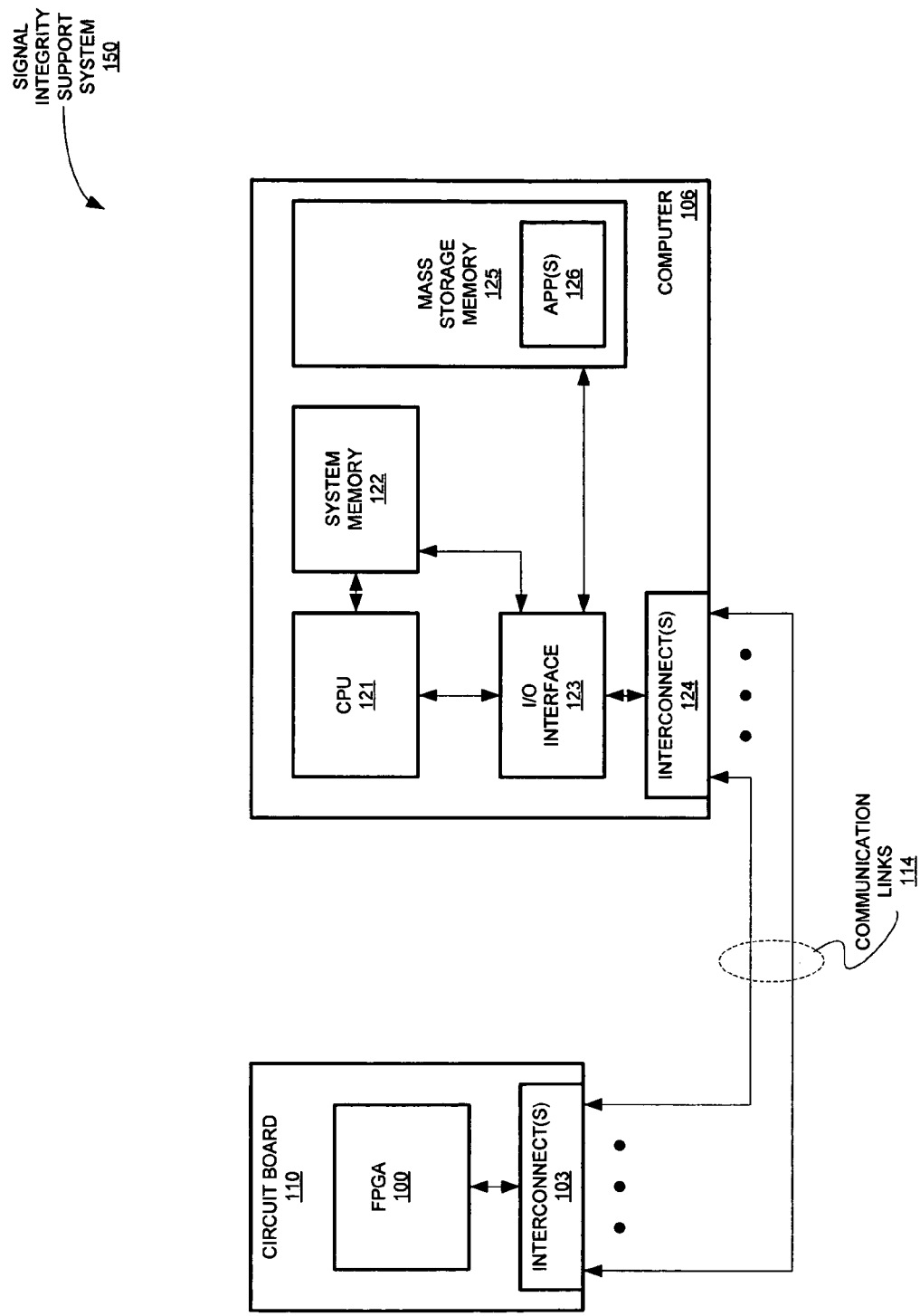
FIG. 1B is a block diagram depicting an alternative exemplary embodiment of the system of FIG. 1A for a single FPGA.

FIG. 1B is a block diagram depicting an alternative exemplary embodiment of system 150 of FIG. 1A for a single FPGA 100 and a single circuit board 110. FPGA 100 is coupled to computer 106 via interconnects 103 and communication links 114. Notably, backplane 101 is not shown in FIG. 1B, but may be included as shown in FIG. 1A or alternatively communication links 114 may be directly connected to circuit board 110. Furthermore, a single FPGA 100 is shown for purposes of clarity, though more than one FPGA may be used, as well as other integrated circuits.

Computer 106 includes interconnects 124, input/output ("I/O") interface 123, central processing unit ("CPU") 121, system memory 122 and mass storage memory 125. As computer 106 is conventional, known details regarding computer 106 are not provided here. Mass storage memory 125 may be used for storing one or more applications 125 for reporting data obtained from FPGA 100 configured as a "built-in" tester. Notably, the term "built-in" such as used in "built-in self-test" or "BIST" is not entirely accurate in this context. A more accurate term of "programmed-in" is used to replace "built-in". Alternatively, one or more applications for reporting data may be located on a computer network for which computer 106 has access via I/O interface 123.

Figure 2:
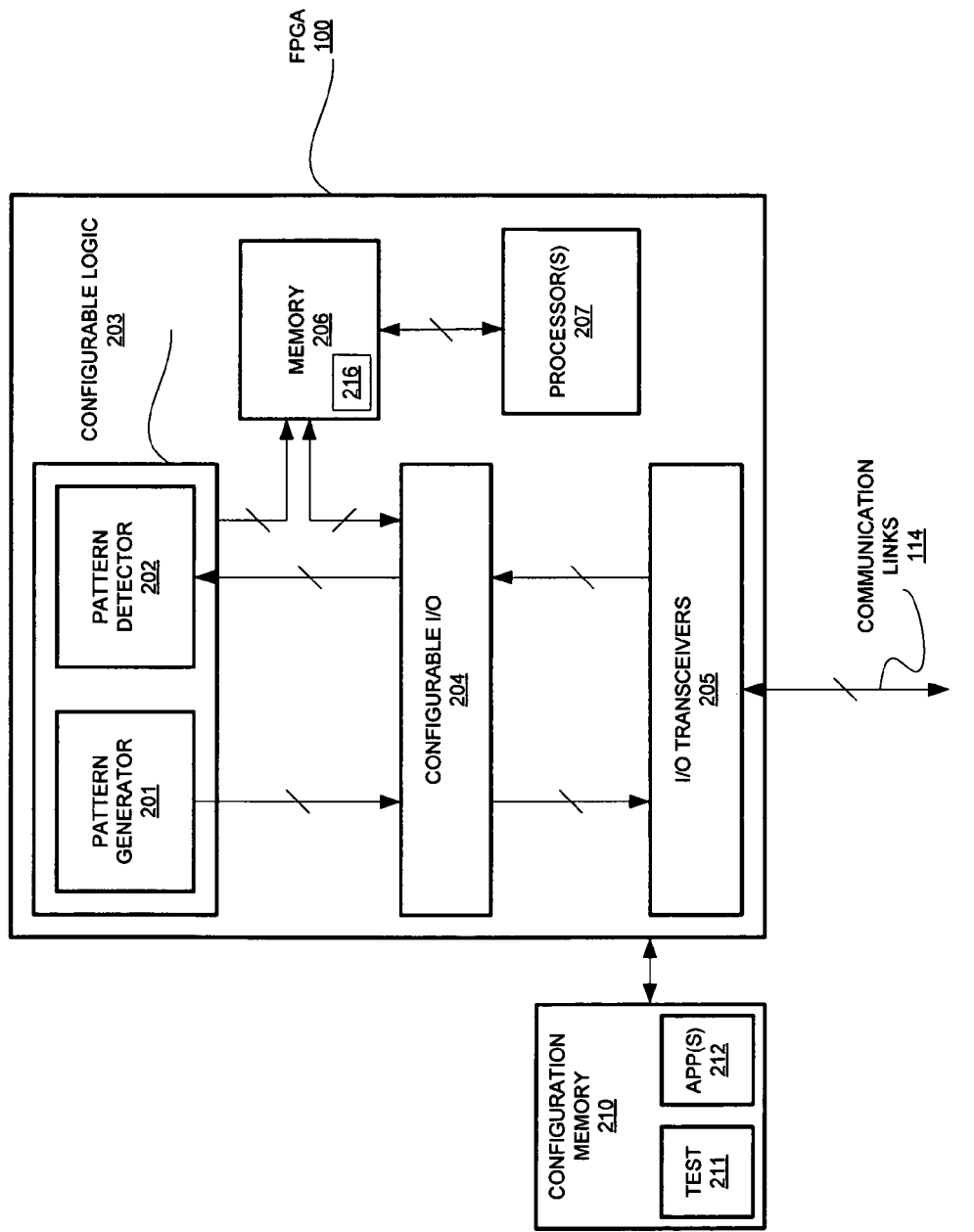
FIG. 2 is a block diagram depicting an exemplary embodiment of a PLD configured for testing.

FPGA 100 may be configured for bit-error-rate ("BER") testing of communication links 114. Notably, it should be appreciated that computer 106 should not be directly connected to an interconnect being tested, unless for example an FPGA 100 used for testing a signal channel is installed in computer 106. Rather computer 106 may be used as an external monitor or controller of FPGA 100 for communicating with a test function embedded in such FPGA 100. Referring to FIG. 2, there is shown a block diagram depicting an exemplary embodiment of FPGA 100 configured for testing. FPGA 100 includes configurable logic 203, configurable I/O 204, memory 206 and I/O transceivers 205. As is known, configurable logic 203 and configurable I/O 204 conventionally include memory for storing information from a bitstream in order to configure FPGA 100. Memory 206 is embedded memory for storing data from pattern detector 202. Additionally, memory 206 may store test pattern information 216 for pattern generator 201. Optionally, FPGA 100 may include one or more embedded processors 207 for processing data from pattern detector 202. Furthermore, rather than or in addition to one or more embedded processors 207, configurable logic 203 may be configured for processing data as part of pattern detector 202 or as one or more separate processors.

Memory external to FPGA 100, such as configuration memory 210, may be disposed on circuit board 100 of FIG. 2 and coupled to FPGA 100. Configuration memory 210 may store a bitstream for configuring FPGA 100 for on-board or chip communication channel test equipment, namely, test bitstream information 211, and for complete or partial reconfiguring of FPGA for one or more applications, namely, application bitstream(s) 212.

When configured for programmed-in test, FPGA 100 may be used to determine BER. A portion of configurable logic 203 may be configured to provide a pattern generator 201, and another portion of configurable logic 203 may be configured to provide a pattern detector 202. Configurable I/O 204 may be configured for providing information from pattern generator 201 to transceivers 205 and for providing received information from transceivers 205 to pattern detector 202.

In operation, FPGA 100 would output one or more bit patterns from pattern generator 201 over one or more communication links 114 in electrical communication with a portion of transceivers 205. Such one or more bit patterns may then be looped back, for example, to another portion of transceivers 205, or the same portion of transceivers if they are bidirectional, for pattern detector 202. Pattern detector 202 then processes the received patterns for bit errors. Resultant data from such bit comparisons may be sent from FPGA 100 to computer 106 for reporting. Alternatively, pattern detector 202 may compare received patterns for bit errors and send results from such bit comparisons to memory 206 for storage for processing by processor 207. Processor 207 may process such comparisons to provide BER data. Such BER data may be stored in memory 206 for subsequent retrieval for analysis.

Notably, after testing is completed, configurable logic portions forming pattern generator 201 and pattern detector 202 may be reprogrammed for reconfiguration of FPGA 100 for one or more applications. Alternatively, a portion of configurable logic 203 may be left configured for interim testing during operation, and another portion of configurable logic 203 may be configured for one or more applications. Thus, for example, if it was desired to have an interim BER test conducted, pattern generator 201 and pattern detector 202, taking up a portion but not all of configurable logic 203, may be left instantiated in FPGA 100, and all or a portion of configurable logic 203 remaining may be used for one or more applications. Configuring configurable logic 203 for one or more applications may include reconfiguring configurable logic 203 provided other programmed-in test circuitry is overwritten.

Figure 3:
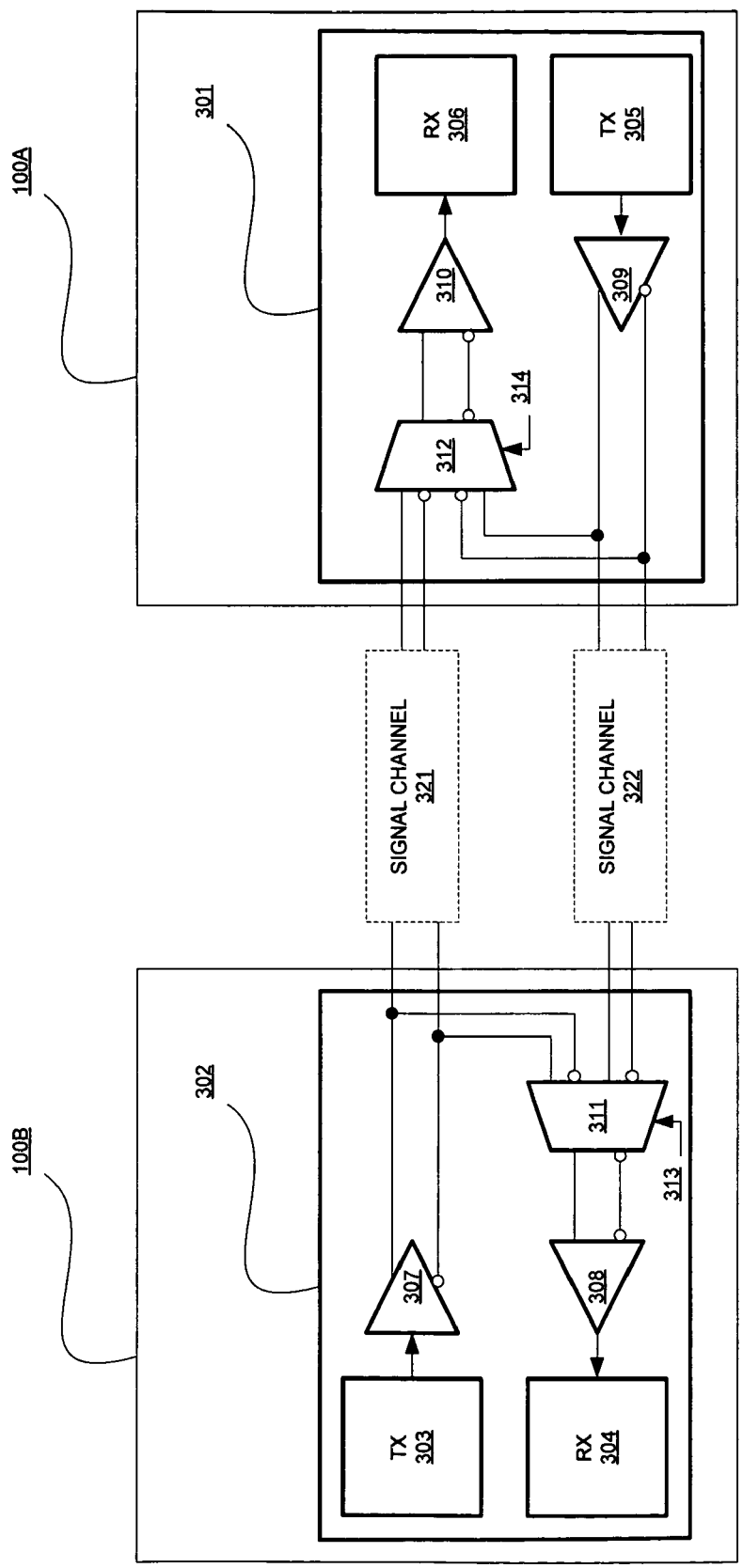
FIG. 3 is a high-level schematic diagram depicting an exemplary embodiment of two FPGAs coupled to one another via signal channels.

FIG. 3 is a high-level schematic diagram depicting an exemplary embodiment of two MGTs 301 and 302 of respective FPGAs 100A and 100B coupled to one another via signal channels 321 and 322. Signal channels 321 and 322 may be intra device, such as between two FPGAs on the same circuit board, or inter device, such as between two circuit boards connected to the same backplane or between two circuit boards coupled over external communication channels. Examples of external communication channels include Synchronous Optical Network ("SONET") channels, Synchronous Digital Hierarchy ("SDH") channels, Ethernet channels, and Asynchronous Transfer Mode ("ATM") channels, among others. (Inverters, shown as circles in FIG. 3, are conventional and thus not described in any detail.)

MGTs 301 and 302 may form respective I/O transceivers of I/O transceivers 205 of FIG. 2. MGT 301 includes transceiver ("TX") 305, receiver ("RX") 306, output buffer 309, input buffer 310 and input multiplexer ("MUX") 312. MGT 302 includes TX 303, RX 304, output buffer 307, input buffer 308 and input MUX 311. Notably, though MGTs 301 and 302 are described, other configurations of FPGA 100 transceivers 205 may be used, such as non-MGT transceivers. Furthermore, though MGTs 301 and 302 are described herein as being embedded in respective FPGAs 100A and 100B for clarity, it should be appreciated that one of MGTs 301 and 302 may be embedded in an integrated circuit with a transceiver other than an FPGA integrated circuit.

Notably, tests separate from BER testing may be used, including reuse of overhead for BER testing, such as configuring a pattern generator for BER and other tests, such as Time Domain Transmissivity ("TDT") and Time Domain Reflectometry ("TDR"). TDT and TDR test modes may be used to measure impedance of a channel. TDT is a technique for testing impedance characteristics of a signaling channel by launching a controlled edge rate pulse into the signaling channel and measuring a resulting voltage (impedance) at a receiving end. TDR is a technique for testing impedance characteristics of a signaling channel by launching a controlled edge rate pulse into the signaling channel and measuring a resulting voltage (impedance) as reflected at a source of the transmission. In operation, an incident wave is sent into a channel of sufficiently short or fast rise time to highlight discontinuities based on transmitted or reflected signals, respectively, detected. Notably, configurable logic of FPGA 100 may be configured to provide such an incident wave and to detect transmitted or reflected signals, depending on mode, as part of pattern generator 201 and pattern detector 202, respectively, of FIG. 2.

For example, from FPGA 10B, MGT 302 could send a controlled edge rate signal via TX 303 and then to output buffer 307 for signal channel 321. Notably, edge rate is used to test channel impedance; however, a bit pattern may be used to test BER. Depending on test mode, MGT 301 and MGT 302 may be synchronized in any of a variety of well-known manners. A controlled edge rate wave may be provided with differential signaling, such as with current mode logic ("CML"). For a TDT mode, FPGA 100A would have prior knowledge of the edge rate or pattern of such a signal sent from FPGA 100B.

With continuing reference to FIG. 3 and renewed reference to FIG. 2, description of the above example for a TDR mode is continued. Select control signals 313 and 314 of MGTs 302 and 301 are used to select whether input from signal channel 321 or signal channel 322 is output. A test signal having a wave, as described above, is sent from TX 303 to output buffer 307. From output buffer 307, the test signal is sent to MUX 311 and then to signal channel 321. The test signal received at MGT 301 is obtained by MUX 312. Accordingly, the test signal is reflected back from MUX 312 onto signal channel 321. From signal channel 321, the reflected test signal is obtained by MUX 311 of MGT 302. Thus, the test signal sent from MGT 302 is subsequently received by MGT 302 as a reflected version thereof. This reflected version may be provided from MUX 311 to input buffer 308 and then to RX 304. Such a test signal may be generated by pattern generator 201 of FPGA 10B, and thus the test signal sent and the test signal received may be compared by pattern detector 202 of FPGA 10B, for example, to determine channel impedance or BER for channel 321.

Continuing the above example for a TDT mode, a test signal is sent from TX 303 to output buffer 307. Select control signals 313 and 314 are for a non-loopback mode. The test signal is sent over signal channel 321 to MGT 301, where it is received by MUX 312. MUX 312 sends the test signal received to input buffer 310, which in turn sends the received test signal to RX 306. Such a test signal may be generated by pattern generator 201 of FPGA 100B, and thus the test signal received is compared by pattern detector 202 of FPGA 100A, for example to determine BER for channel 321. Again, FPGAs 100A and 100B may be synchronized for test modes. Thus, in the above example for BER, FPGA 100A would know what pattern to expect for the test signal received.

Conversely, channel 322 may be tested with TDR or TDT modes by sending a test signal from MGT 301 towards MGT 302 over channel 322. Furthermore, both channels 321 and 322 may be tested at the same time to check for cross-talk. Furthermore, it should be appreciated that each FPGA may have multiple MGTs such that more than two signal channels may be used to put such FPGAs in electrical communication. Accordingly, multiple channels of a number greater than two may be tested for cross-talk and other multi-channel parasitic effects.

Figure 4:
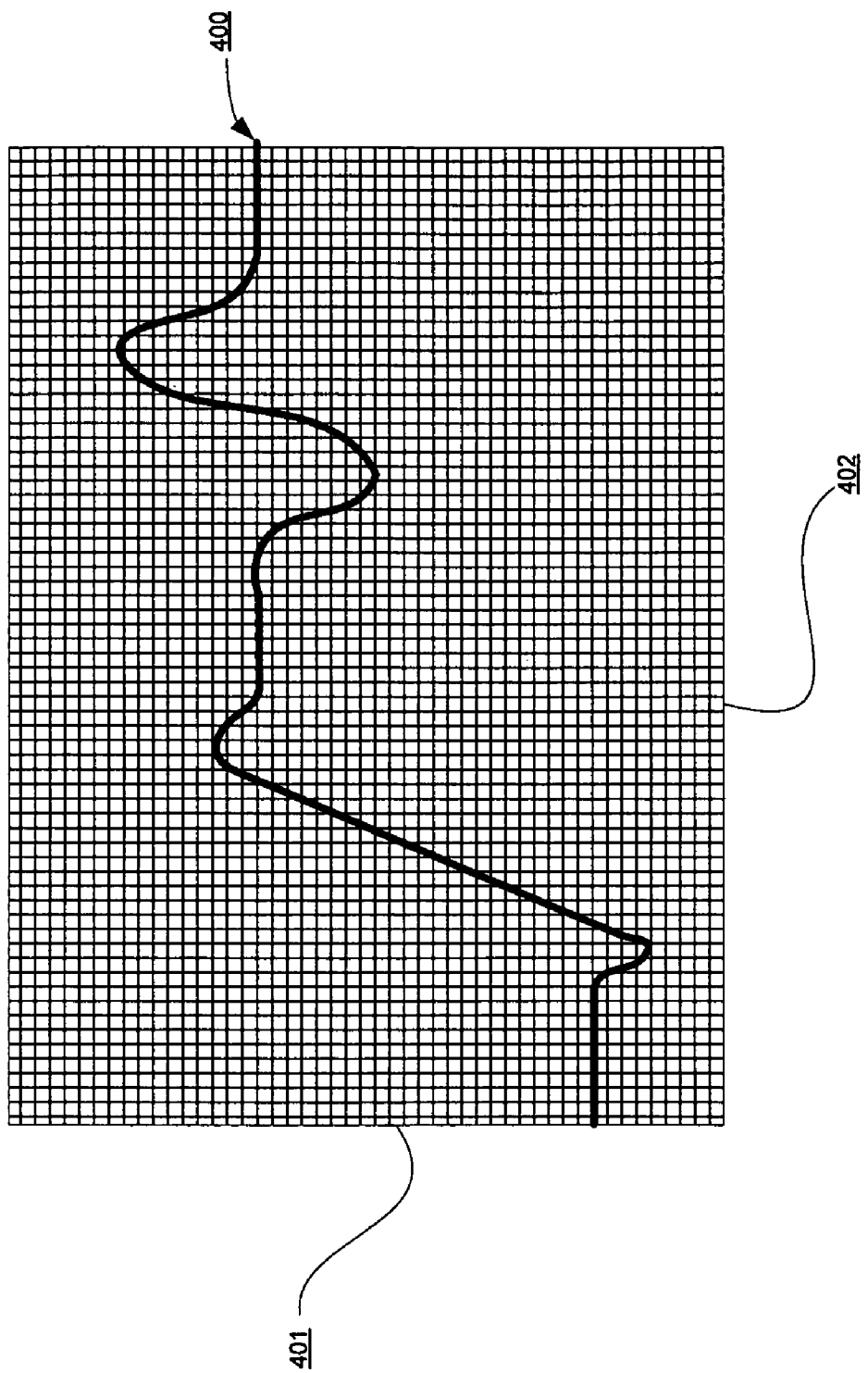
FIG. 4 is a graph depicting an exemplary embodiment of a sample data output obtainable from a PLD configured for testing.

FIG. 4 is a graph depicting an exemplary embodiment of a sample data output 400 obtainable from a PLD, such as an FPGA, configured for testing. Axis 401 is for a variable threshold voltage, and axis 402 is for data sampling, namely, data samples taken for a selected threshold voltage.

Figure 5:
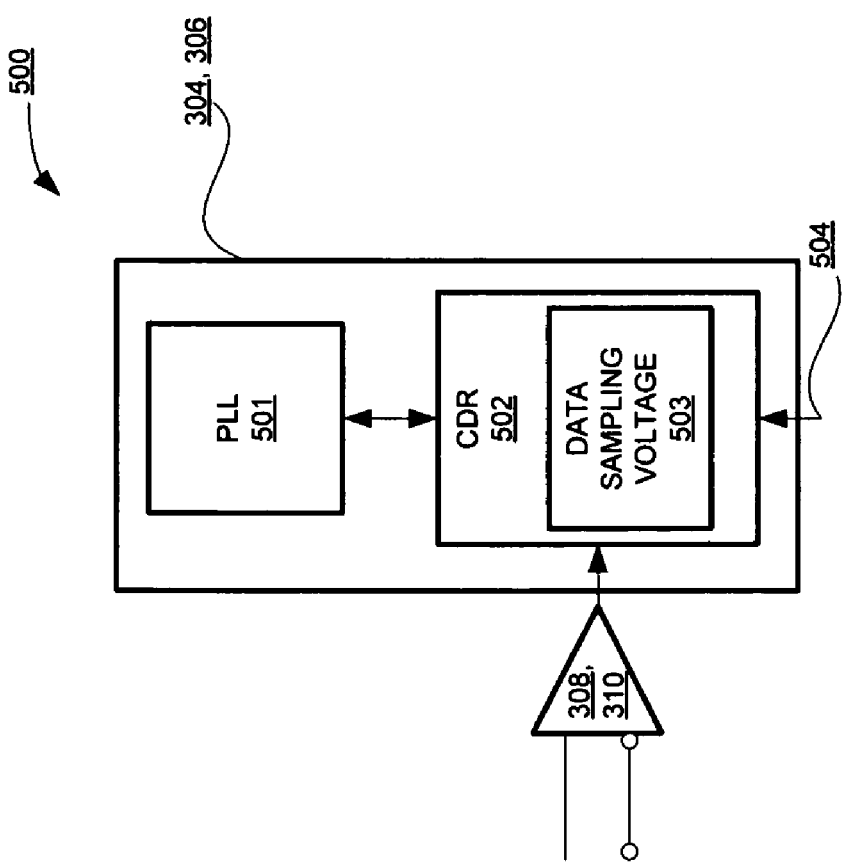
FIG. 5 is a block diagram of an exemplary embodiment of a portion of a receive side of an MGT.

FIG. 5 is a block diagram of an exemplary embodiment of a portion of a receive side 500 of an MGT 301 or 302. A received data signal, including a test data signal, is obtained by buffer 308 or 310 and provided to RX 304 or 306, respectively. Each RX 304, 306 includes a phase-locked loop ("PLL") 501 and clock data recovery circuitry ("CDR") 502. CDR 502 further includes a data sampling voltage circuit 503, which is adjustable responsive to a voltage control signal 504. In this manner, data sampling voltage 503 is a variable threshold voltage for detection of data, including test data. With an RX 304 or 306 locked by PLL 501, voltage control signal 504 may be varied for each of a plurality of iterations of test signals. The data from each of such iterations may be processed, for example to provide a histogram, to get an indication of channel performance, as indicate by sample data output 400 of FIG. 4. Voltage control signal 504 may be provided by configuring configurable logic to provide a programmable logic solution, or ASIC or discrete logic may be used to provide control signal 504.

A synthesis signal may be reconstructed from data samples obtained responsive to data sampling threshold voltage. Furthermore, multiple data samples may be taken at each threshold voltage to average out irregularities, such as jitter, quantization error, and other uncertainties. Notably, signal resolution is proportional to data rate of RX 304 or 306 (e.g., 10 Gigabits per second equals 100 Pico-second resolution). Post processing of such data may be done using monitor 105 and computer 106 of FIG. 1, or with an embedded display (not shown) and embedded processor 207 of FIG. 2.

Accordingly, it should be appreciated that by having a PLD programmed with test capability, such a PLD may be used for programmed-in testing and then reprogrammed or partially reprogrammed for one or more other applications. Furthermore, such a PLD may continue to be used, at least in part, for error detection while operating, for example for channel integrity detection. Additionally, depending on customer plans, a PLD may be a significantly less expensive option as compared with BER test equipment or one or more ASICs or ASSPs.

With high-speed serial communications, FPGAs may be deployed for telecom, datacom and storage applications. Accordingly, by allowing non-intrusive testing of developmental or production units with reduced system resource overhead, component development and validation, system validation and test, and system production test and in-field maintenance are facilitated. Furthermore, multi-channel effects, such as cross-talk, among others, may be tested whether intra-device or inter-devices.

Though TDT and TDR test modes have been described, it should be understood that PLDs may be configured for other types of tests, for example testing for BER, fast BER testing (e.g., stressed channel), jitter (e.g., total, DJ and RJ), jitter transfer, error location analysis, and sensitivity analysis. Moreover, such test modes may be run with multiple channels to test multi-channel effects. Furthermore, data processing is facilitated, such as by histograms, as described above, or with bathtub curves, and eye diagrams, among others. With respect to eye diagrams, because the sampling point may be changed by varying threshold voltage, the sampling point within the eye may be varied. Thus, it should be understood that by reconfiguring an FPGA multiple tests may be accommodated, as well as accommodating normal operational functions, with overhead reuse.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A channel test system, comprising:
a programmable logic device having programmable logic;
configuration memory coupled to the programmable logic device, the configuration memory for storing applications for channel testing, the applications for channel testing for configuring the programmable logic device to perform respective test operations; wherein the programmable logic device comprises transceivers, at least one of the transceivers configured to provide a variable threshold voltage for sampling; and
wherein at least one of the transceivers is configured to provide a controlled edge rate signal.

2. The channel test systems according to claim 1, wherein at least an application of the applications for channel testing is for configuring the programmable logic with a pattern generator.

3. The channel test system, according to claim 1, wherein at least an application of the applications for channel testing is for configuring the programmable logic with a pattern detector.

4. The channel test system, according to claim 1, wherein at least an application of the applications for channel testing is for a Time Domain Reflectometry mode.

5. The channel test system, according to claim 1, wherein at least an application of the applications for channel testing is for a Time Domain Transmissivity mode.

6. The channel test system, according to claim 1, wherein at least an application of the application for channel testing is to configure the programmable logic to provide an incident wave.

7. The channel test system, according to claim 1, wherein at least an application of the applications for channel testing is for a bit error rate test mode.

* * * * *